United States Patent
Lin et al.

(10) Patent No.: US 12,339,572 B2
(45) Date of Patent: Jun. 24, 2025

(54) HEAT DISSIPATING MODULE AND PROJECTION DEVICE

(71) Applicant: Coretronic Corporation, Hsin-Chu (TW)

(72) Inventors: Shi-Wen Lin, Hsin-Chu (TW); Wei-Chi Liu, Hsin-Chu (TW); Tsung-Ching Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 480 days.

(21) Appl. No.: 17/878,919

(22) Filed: Aug. 2, 2022

(65) Prior Publication Data

US 2023/0033834 A1    Feb. 2, 2023

(30) Foreign Application Priority Data

Aug. 2, 2021    (CN) .......................... 202110879005.6

(51) Int. Cl.
*G03B 21/16*    (2006.01)
*H05K 7/20*     (2006.01)

(52) U.S. Cl.
CPC ......... *G03B 21/16* (2013.01); *H05K 7/20272* (2013.01)

(58) Field of Classification Search
CPC .......................... G03B 21/16; H05K 7/20272
USPC .......................................................... 353/54
See application file for complete search history.

(56) References Cited

U.S. PATENT DOCUMENTS

| 6,267,147 | B1 | 7/2001 | Rago |
| 2016/0338224 | A1 | 11/2016 | Chen et al. |

FOREIGN PATENT DOCUMENTS

| CN | 2657080 | | 11/2004 | |
| CN | 204187069 | | 3/2015 | |
| CN | 107290915 | A * | 10/2017 | ............. G03B 21/16 |
| CN | 211577644 | | 9/2020 | |
| CN | 211741816 | | 10/2020 | |
| CN | 112283997 | | 1/2021 | |
| CN | 213064771 | U * | 4/2021 | ............. F16K 15/18 |
| TW | M380392 | | 5/2010 | |

OTHER PUBLICATIONS

"Office Action of China Counterpart Application", issued on Apr. 17, 2025, p. 1-p. 9.

* cited by examiner

*Primary Examiner* — Magda Cruz
(74) *Attorney, Agent, or Firm* — JCIPRNET (57) ABSTRACT

A heat dissipating module includes a casing including a bottom plate and a water inlet; a cover plate disposed on one side of the casing opposite to the bottom plate; a pressurizing device moving back and forth in the casing and having a maximum stroke; a water pump disposed between the bottom plate and the pressurizing device, where liquid fills a space between the water pump and the pressurizing device to define a water tank; and a stop valve disposed in the water tank and located between the pressurizing device and the water pump. According to a direction from the bottom plate to the cover plate, the height of the water inlet is lower than the stop valve. The heat dissipating module has a small volume and is configured to flip at multiple angles. A projection device including the heat dissipating module and having structural reliability is also provided.

11 Claims, 5 Drawing Sheets

HEAT DISSIPATING MODULE AND PROJECTION DEVICE

CROSS-REFERENCE TO RELATED APPLICATION

This application claims the priority benefit of China application serial no. 202110879005.6, filed on Aug. 2, 2021. The entirety of the above-mentioned patent application is hereby incorporated by reference herein and made a part of this specification.

BACKGROUND OF THE INVENTION

1. Field of the Invention

The invention relates to a heat dissipating module and a projection device; more particularly, the invention relates to a heat dissipating module occupying a relatively small volume and a projection device using the heat dissipating module.

2. Description of Related Art

A water-cooling heat dissipating module is composed of a radiator, a water tank, a water-cooling plate, and a water pump. Here, the water pump is the power supply of the entire water-cooling heat dissipating module, and thus the design of the water pump is crucial to the water-cooling heat dissipating module. At present, the water pump and the water tank may be individual designs or may be an integrated design. If the water pump and the water tank are individual designs, the water pump and the water tank are independent elements and are connected by a hose or a metal pipe, and the disadvantage of the individual designs lies in that the space required by these elements is relatively large. If the water pump and the water tank constitute the integrated design, the water tank is placed on the top, the water pump is placed on the bottom, and the two are combined into one, which may reduce the space required for installation of the water pump and the water tank, thereby reducing the volume of the resultant product.

However, whether the water pump and water tank are the individual designs or the integrated design, fluid circulating therein may be dissipated through pipelines after long-term operation, thus resulting in a drop in the water level. This may reduce the service life of the product equipped with said water-cooling heat dissipating module. In order to resolve such an issue, it is necessary to increase the volume of the water tank, which leads to an increase in the volume of the product and thus poses a limitation to the application range of the water-cooling heat dissipating module and the products having the water-cooling heat dissipating module. In addition, the design of the water-cooling heat dissipating module often limits the module to be applied at only one single angle. Therefore, if the product is required to be used at multiple angles, the water pump cannot provide efficient fluid suction, which results in the idling and the failure of the water pump and further burns out the water pump.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY OF THE INVENTION

The invention provides a heat dissipating module which has a relatively small volume and is capable of flipping at multiple angles.

The invention also provides a projection device which includes the heat dissipating module and has favorable structural reliability.

Other objectives and advantages of the invention may further be learned from technical features disclosed in the invention.

In order to achieve one or a part or all of the foregoing objectives or other objectives, an embodiment of the invention provides a heat dissipating module that includes a casing, a cover plate, a pressurizing device, a water pump, and a stop valve. The casing includes a bottom plate and has a water inlet. The cover plate is disposed on one side of the casing opposite to the bottom plate. The pressurizing device moves back and forth in the casing and has a maximum stroke. The water pump is disposed between the bottom plate and the pressurizing device; here, liquid fills a space between the water pump and the pressurizing device to define a water tank. The stop valve is disposed in the water tank and located between the pressurizing device and the water pump. The maximum stroke of the pressurizing device is a distance between the cover plate and the stop valve. According to a direction from the bottom plate to the cover plate, a first height of the water inlet is lower than a second height of the stop valve.

In order to achieve one or a part or all of the foregoing objectives or other objectives, an embodiment of the invention provides a projection device that includes a chassis, a light source, an optical-mechanical module, and a heat dissipating module. The light source is disposed in the chassis. The optical-mechanical module is disposed in the chassis and includes a light valve and a projection lens. The light source is configured to provide an illumination beam to the optical-mechanical module. The light valve is configured to be disposed on a transmission path of the illumination beam and configured to convert the illumination beam to an image beam. The projection lens is disposed on a transmission path of the image beam and configured to project the image beam out of the projection device. The heat dissipating module is disposed in chassis and connected to the light source or the optical-mechanical module. The heat dissipating module includes a casing, a cover plate, a pressurizing device, a water pump, and a stop valve. The casing includes a bottom plate and has a water inlet. The cover plate is disposed on one side of the casing opposite to the bottom plate. The pressurizing device moves back and forth in the casing and has a maximum stroke. The water pump is disposed between the bottom plate and the pressurizing device, and liquid fills a space between the water pump and the pressurizing device to define a water tank. The stop valve is disposed in the water tank and located between the pressurizing device and the water pump. The maximum stroke of the pressurizing device is a distance between the cover plate and the stop valve. According to a direction from the bottom plate to the cover plate, a first height of the water inlet is lower than a second height of the stop valve.

In view of the above, one or more embodiments of the invention have at least one of the following advantages or effects. In the design of the heat dissipating module provided in one or more embodiments of the invention, the water pump is disposed between the bottom plate and the pressurizing device, and liquid fills the space between the water pump and the pressurizing device to define the water tank, thereby reducing the space and the volume required by the water-cooling system. In addition, the pressurizing device installed in the casing allows the water tank to be maintained at a full water level, which ensures that the water pump may not provide efficient fluid suction during the long-term operation. Besides, when the heat dissipating module is applied at multiple angles, since the water tank is maintained at the full water level, the known issue of the failure of the water pump resulting from the fact that the water pump may merely suck in air due to a flipping action of the water tank may be prevented. In another aspect, the projection device using the heat dissipating module provided in one or more embodiments of the invention may have favorable structural reliability.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
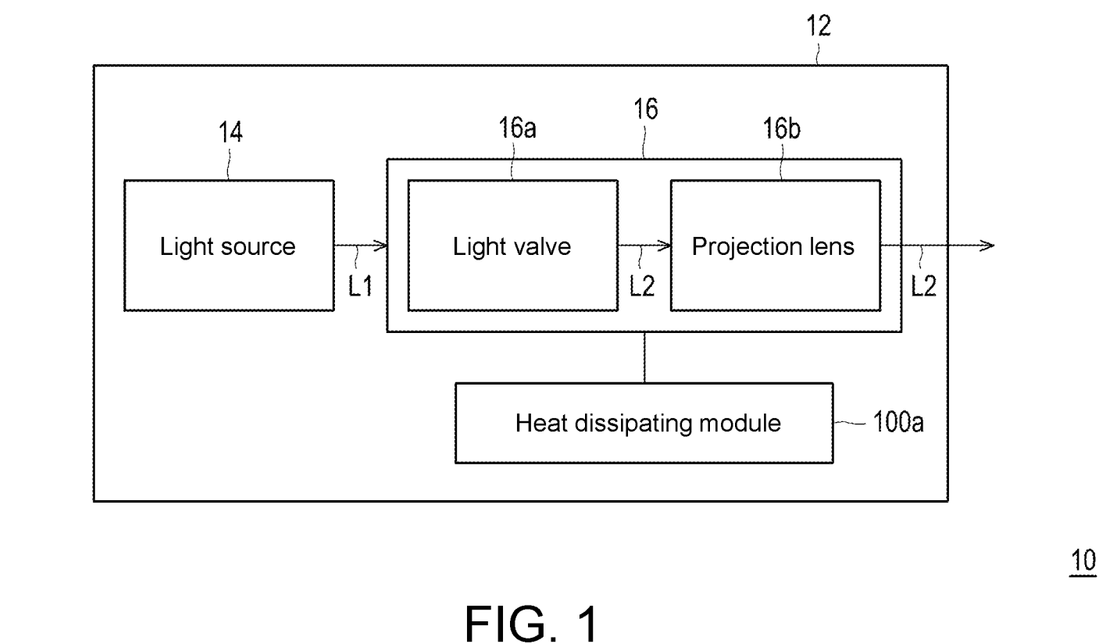
FIG. 1 is a schematic view of a projection device according to an embodiment of the invention.

FIG. 1 is a schematic view of a projection device according to an embodiment of the invention. With reference to FIG. 1, in this embodiment, a projection device 10 includes a chassis 12, a light source 14, an optical-mechanical module 16, and a heat dissipating module 100a. The light source 14 is disposed in the chassis 12. The optical-mechanical module 16 is disposed in the chassis 12, and the optical-mechanical module 16 includes a light valve 16a and a projection lens 16b. The light source 14 is configured to provide an illumination beam L1 to the optical-mechanical module 16. The light valve 16a is configured to be disposed on a transmission path of the illumination beam L1 and configured to convert the illumination beam L1 to an image beam L2. The projection lens 16b is disposed on a transmission path of the image beam L2 and configured to project the image beam L2 out of the projection device 10. That is, the light source 14 is configured to emit the illumination beam L1 which is projected to a display screen (not shown) on the outside of the projection device 10 through the projection lens 16b after the illumination beam L1 is converted by the light valve 16a. Here, the light source 14 is, for instance, a light emitting diode (LED), a laser diode (LD), a high-pressure mercury lamp, or any other appropriate light source. The heat dissipating module 100a is disposed in the chassis 12 and connected to the optical-mechanical module 16. In another embodiment, the heat dissipating module 100a may also be connected to the light source 14, which should not be construed as a limitation to the invention.

To be specific, the light valve 16a provided in this embodiment is, for instance, a reflective optical modulator, such as a liquid crystal on silicon (LCoS) panel, a digital micro-mirror device (DMD), and so on. In an embodiment, the light valve 16a is, for instance, a transmissive optical modulator, such as a transparent liquid crystal panel, an electro-optical modulator, a magneto-optic modulator, an acousto-optic modulator (AOM), and so on. The type and the form of the light valve 16a are not limited in this embodiment. Sufficient teachings, suggestions, and implementation descriptions of detailed steps and implementation manners of a method of converting the illumination beam L1 to the image beam L2 by the light valve 16a may be obtained from common knowledge in the pertinent field and thus are not further explained hereinafter. In addition, the projection lens 16b includes, for instance, various combinations of one or more non-planar optical lenses with refractive power, such as a biconcave lens, a biconvex lens, a concave-convex lens, a convex-concave lens, a plano-convex lens, a plano-concave lens, and so on. In an embodiment, the projection lens 16b may also include a planar optical lens to project the image beam L2 from the light valve 16a out of the projection device 10 in a reflective or transmissive manner. Here, the form and the type of the projection lens 16b should not be construed as limitations in the embodiment.

Figure 2A:
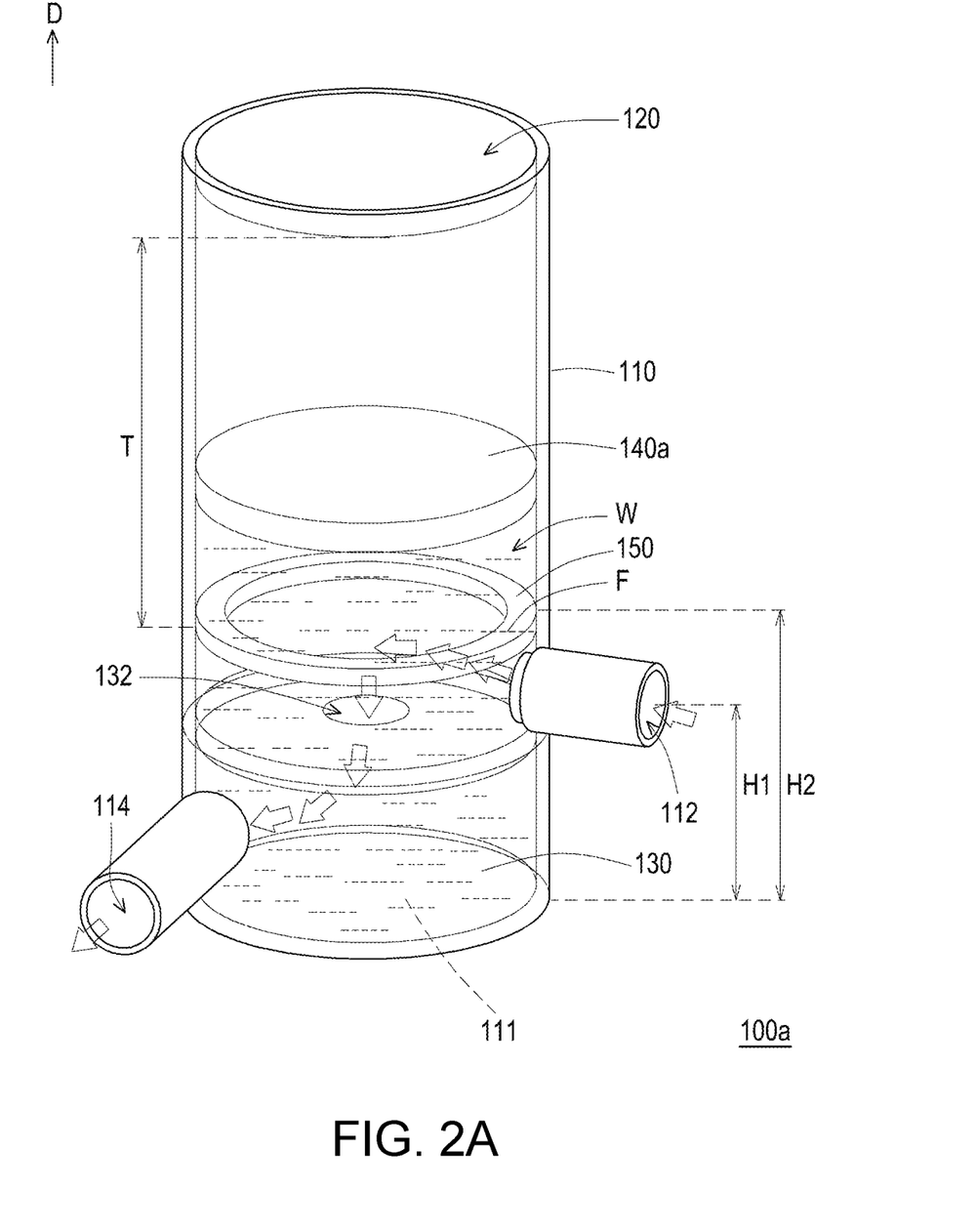
FIG. 2A is a schematic three-dimensional perspective view of a heat dissipating module in the projection device depicted in FIG. 1.
Figure 2B:
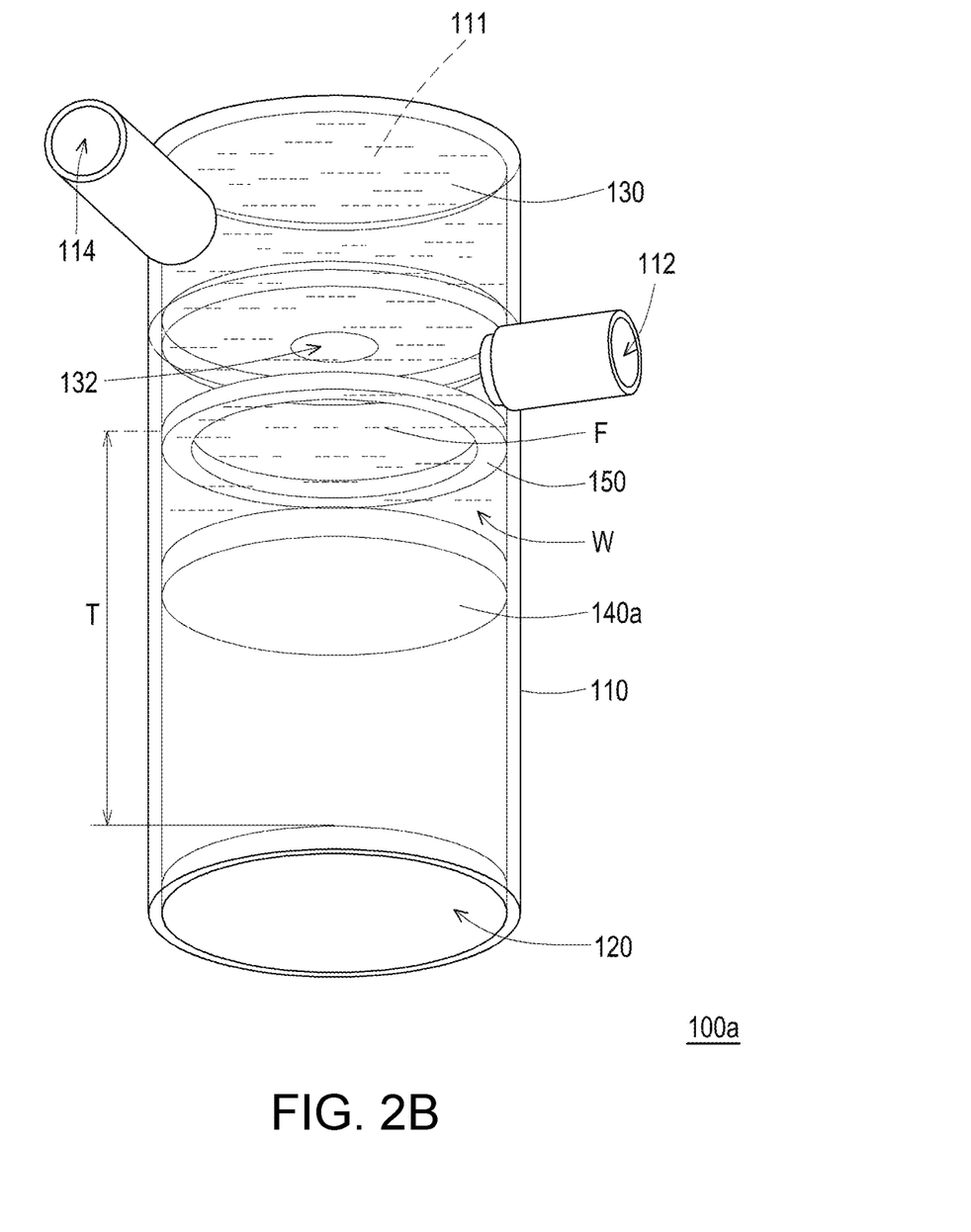
FIG. 2B is a schematic three-dimensional perspective view illustrating that the heat dissipating module depicted in FIG. 2A is flipped.

FIG. 2A is a schematic three-dimensional perspective view of a heat dissipating module in the projection device depicted in FIG. 1. FIG. 2B is a schematic three-dimensional perspective view illustrating that the heat dissipating module depicted in FIG. 2A is flipped. With reference to FIG. 2A, in this embodiment, the heat dissipating module 100a includes a casing 110, a cover plate 120, a water pump 130, a pressurizing device 140a, and a stop valve 150. The casing 110 includes a bottom plate 111, and the casing 110 has a water inlet 112. The cover plate 120 is disposed on one side of the casing 110 opposite to the bottom plate 111. The casing 110 and the cover plate 120 may be integrally formed or two independent elements, which should not be construed as a limitation to the invention. The water pump 130 is disposed between the bottom plate 111 and the pressurizing device 140a; here, liquid F fills a space between the water pump 130 and the pressurizing device 140a to define a water tank W. The pressurizing device 140a moves back and forth in the casing 110 and has a maximum stroke. The stop valve 150 is disposed in the water tank W and located between the pressurizing device 140a and the water pump 130. Here, the maximum stroke of the pressurizing device 140a is a distance T between the cover plate 120 and the stop valve 150. According to a direction D from the bottom plate 111 to the cover plate 120, a first height H1 of the water inlet 112 is lower than a second height H2 of the stop valve 150.

In particular, the casing 110 provided in this embodiment further has a water outlet 114 communicating with the water pump 130. Moreover, the water pump 130 provided in this embodiment has a water suction port 132; here, the water inlet 112 communicates with the water tank W, the water inlet 112 communicates with the water outlet 114 through the water suction port 132, and the communication route from the water inlet 112 to the water outlet 114 is shown by arrows in FIG. 2A. The water pump 130 is, for instance, a centrifugal pump, which should not be construed as a limitation to the invention.

Since the water pump 130 and the water tank W are provided in this embodiment, the heat dissipating module 100a provided in this embodiment may be considered as a water-cooling heat dissipating module. Besides, the water pump 130 and the water tank W provided in this embodiment are both located in the casing 110; namely, the water pump 130 and the water tank W are combined into one, so as to reduce the space and the volume required by the water-cooling system. In addition, the pressurizing device 140a provided in the present embodiment is arranged in the casing 110, which allows the water tank W to be maintained at a full water level, so as to ensure that the water pump 130 may provide efficient suction of the liquid F during the long-term operation. In addition, if the water tank is flipped, the water level of the water tank drops, and the water pump is located above the water tank, which may lead to a known issue of the failure of the water pump resulting from the fact that the water pump may merely suck in air. Here, as shown in FIG. 2A and FIG. 2B, when the heat dissipating module 100a is applied at multiple angles, e.g., the usage range of the heat dissipating module 100a is, for instance, between 0 degree and 360 degrees, the water tank W is continuously maintained at the full water level, and thus said known issue may be prevented. In other words, the pressurizing device 140a provided in this embodiment allows the water tank W to be maintained in a full-water state when the heat dissipating module 100a is applied at multiple angles, so that the integrated heat dissipating module 100a may be used on the condition of 360-degree operations. On the other hand, the projection device 10 using the heat dissipating module 100a provided in this embodiment may have favorable structural reliability.

Note that the reference numbers and some content provided in the previous embodiments are also applicable in the following embodiments, wherein the same reference numbers serve to denote the same or similar elements, and the descriptions of the same technical content are omitted. Reference of the omitted descriptions may be made to the foregoing embodiments, and the omitted descriptions will not be further provided in the following embodiments.

Figure 3A:
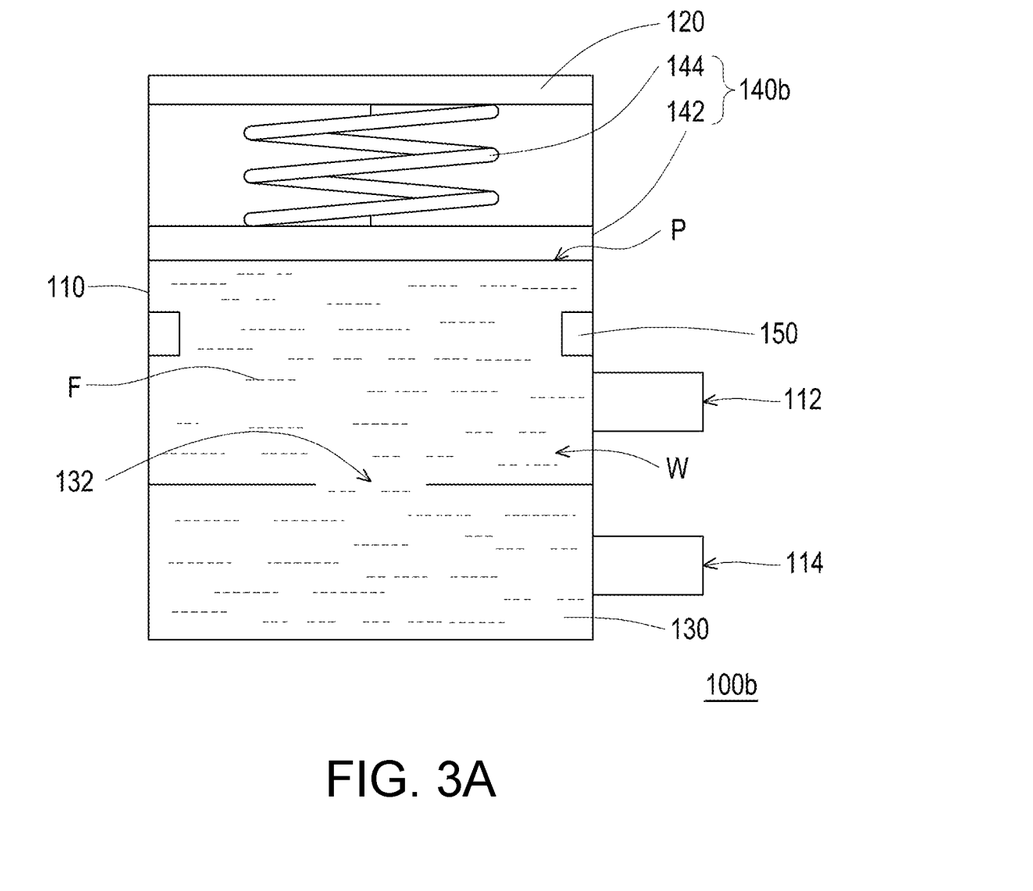
FIG. 3A is a schematic view of a heat dissipating module according to an embodiment of the invention.

FIG. 3A is a schematic view of a heat dissipating module according to an embodiment of the invention. With reference to FIG. 2A and FIG. 3A, a heat dissipating module 100b provided in this embodiment is similar to the heat dissipating module 100a depicted in FIG. 2A, while the difference therebetween lies in that the pressurizing device 140b of the heat dissipating module 100b in this embodiment includes a pressurizer 142 and a spring 144, wherein the spring 144 is disposed between the cover plate 120 and the pressurizer 142. When a level P of the liquid F drops, the spring 144 of the pressurizing device 140b is configured to apply a pressure force to the pressurizer 142, and the pressurizer 142 transmits the pressure force to the liquid F. Since the liquid F (e.g., water) is incompressible fluid, a reaction force is generated after the pressure force is applied, which leads to a force balance on both sides of the pressurizer 142. Thereby, the pressurizer 142 stays at a location with the same height as that of the level P of the liquid F. Here, the pressurizing device 140b is embodied as an elastic automatic pressurizing device. The design of the pressurizing device 140b allows the water tank W of the heat dissipating module 100b to be maintained at the full water level, which ensures that the water pump 130 may provide efficient suction of the liquid F during long-term operation.

Figure 3B:
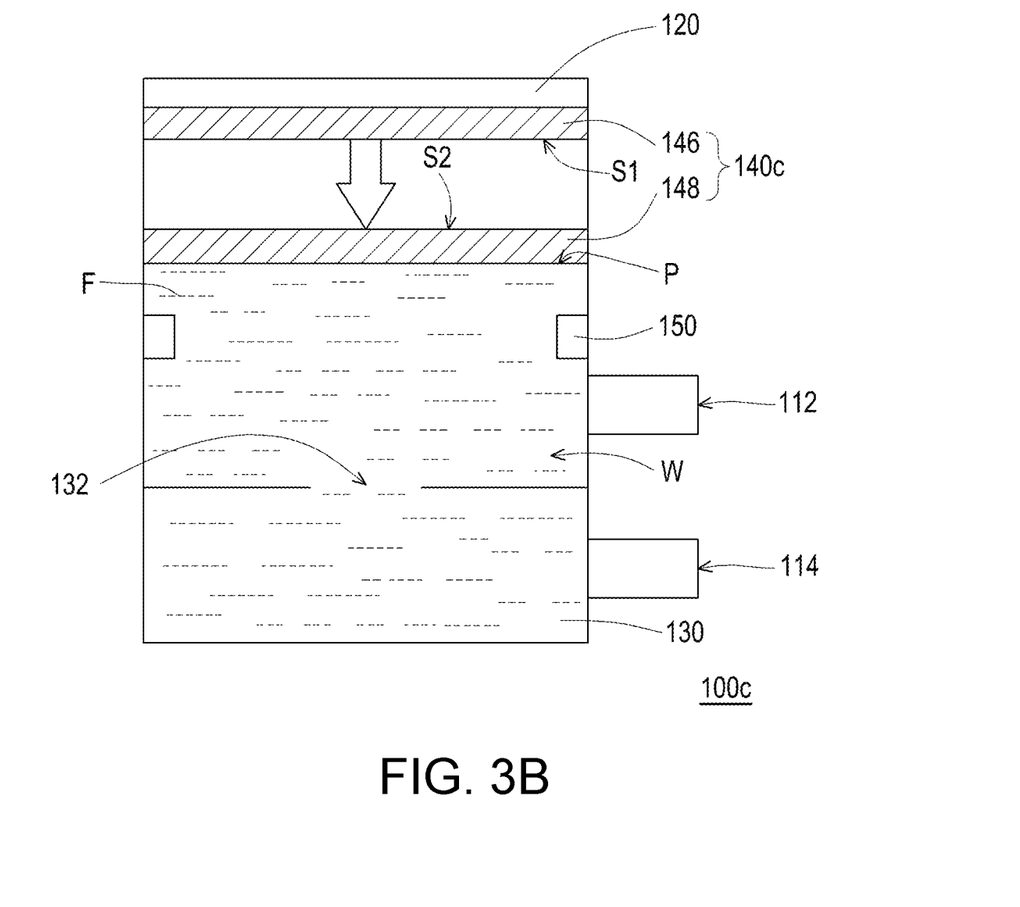
FIG. 3B is a schematic view of a heat dissipating module according to another embodiment of the invention.

FIG. 3B is a schematic view of a heat dissipating module according to another embodiment of the invention. With reference to FIG. 2A and FIG. 3B, a heat dissipating module 100c provided in this embodiment is similar to the heat dissipating module 100a depicted in FIG. 2A, while the difference therebetween lies in that the pressurizing device 140c of the heat dissipating module 100c provided in this embodiment includes a first magnet 146 and a second magnet 148, wherein the first magnet 146 is disposed between the cover plate 120 and the second magnet 148, and the maximum stroke of the second magnet 148 reaches the stop valve 150. A first surface S1 of the first magnet 146 and a second surface S2 of the second magnet 148 are opposite to each other and have the same magnetic pole (such as N to N or S to S). According to the principle of a force of repulsion generated when the same magnetic poles are pushed together, the first magnet 146 and the second magnet 148 may generate thrust, which allows the second magnet 148 to stay at a location with the same height as the height of the level P of the liquid F. Here, the pressurizing device 140c is embodied as a magnetically levitated automatic pressurizing device. This design of the pressurizing device 140c allows the water tank W of the heat dissipating module 100c to be maintained at the full water level, which ensures that the water pump 130 may provide efficient suction of the liquid F during long-term operation.

To sum up, one or more embodiments of the invention have at least one of the following advantages or effects. In the design of the heat dissipating module provided in one or more embodiments of the invention, the water pump is disposed between the bottom plate and the pressurizing device, and the liquid fills the space between the water pump and the pressurizing device to define the water tank, thereby reducing the space and the volume required by the water-cooling system. In addition, the pressurizing device installed in the casing allows the water tank to be maintained at a full water level, which ensures that the water pump may provide efficient suction of the liquid during the long-term operation. In addition, if the water tank is flipped, the water level of the water tank drops, and the water pump is located above the water tank, which may lead to a known issue of the failure of the water pump resulting from the fact that the water pump may merely suck in air. In one or more embodiments of the invention, when the heat dissipating module is applied at multiple angles, the water tank is continuously maintained at the full water level, and thus said known issue may be prevented. In another aspect, the projection device using the heat dissipating module provided in one or more embodiments of the invention may have favorable structural reliability.

The foregoing description of the preferred of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A heat dissipating module, comprising a casing, a cover plate, a pressurizing device, a water pump, and a stop valve, wherein:
    the casing comprises a bottom plate and a water inlet;
    the cover plate is disposed on a side of the casing opposite to the bottom plate;
    the pressurizing device moves back and forth in the casing and has a maximum stroke;
    the water pump is disposed between the bottom plate and the pressurizing device, wherein liquid fills a space between the water pump and the pressurizing device to define a water tank; and
    the stop valve is disposed in the water tank and located between the pressurizing device and the water pump, wherein the maximum stroke of the pressurizing device is a distance between the cover plate and the stop valve, and according to a direction from the bottom plate to the cover plate, the water inlet is disposed at a first height, the stop valve is disposed at a second height, and the first height is lower than the second height.

2. The heat dissipating module according to claim 1, wherein the casing further has a water outlet, and the water outlet communicates with the water pump.

3. The heat dissipating module according to claim 2, wherein the water pump has a water suction port, the water inlet communicates with the water tank, and the water inlet communicates with the water outlet through the water suction port.

4. The heat dissipating module according to claim 1, wherein the pressurizing device comprises a pressurizer and a spring, the spring is disposed between the cover plate and the pressurizer, and the spring is configured to apply a pressure to the pressurizer, so that the pressurizer stays at a location with a same height as a height of a liquid level of the liquid.

5. The heat dissipating module according to claim 4, wherein the pressurizing device is an elastic automatic pressurizing device.

6. The heat dissipating module according to claim 1, wherein the pressurizing device comprises a first magnet and a second magnet, and a first surface of the first magnet and a second surface of the second magnet face each other and have a same magnetic pole.

7. The heat dissipating module according to claim 6, wherein the first magnet is disposed between the cover plate and the second magnet, and the second magnet stays at a location with a same height as a height of a liquid level of the liquid.

8. The heat dissipating module according to claim 6, wherein the pressurizing device is a magnetically levitated automatic pressurizing device.

9. The heat dissipating module according to claim 1, wherein the water pump comprises a centrifugal pump.

10. The heat dissipating module according to claim 1, wherein a usage range of the heat dissipating module is from 0 degree to 360 degrees.

11. A projection device, comprising a chassis, a light source, an optical-mechanical module, and a heat dissipating module, wherein:
    the light source is disposed in the chassis;
    the optical-mechanical module is disposed in the chassis and comprises a light valve and a projection lens, wherein the light source is configured to provide an illumination beam to the optical-mechanical module, the light valve is configured to be disposed on a transmission path of the illumination beam and configured to convert the illumination beam to an image beam, and the projection lens is disposed on a transmission path of the image beam and configured to project the image beam out of the projection device; and the heat dissipating module is disposed in the chassis and connected to the light source or the optical-mechanical module, and the heat dissipating module comprises a casing, a cover plate, a pressurizing device, a water pump, and a stop valve, wherein:

the casing comprises a bottom plate and a water inlet;

the cover plate is disposed on a side of the casing opposite to the bottom plate;

the pressurizing device moves back and forth in the casing and has a maximum stroke;

the water pump is disposed between the bottom plate and the pressurizing device, wherein liquid fills a space between the water pump and the pressurizing device to define a water tank; and the stop valve is disposed in the water tank and located between the pressurizing device and the water pump, wherein the maximum stroke of the pressurizing device is a distance between the cover plate and the stop valve, and according to a direction from the bottom plate to the cover plate, the water inlet is disposed at a first height, the stop valve is disposed at a second height, and the first height is lower than the second height.

* * * * *